Figure 1:
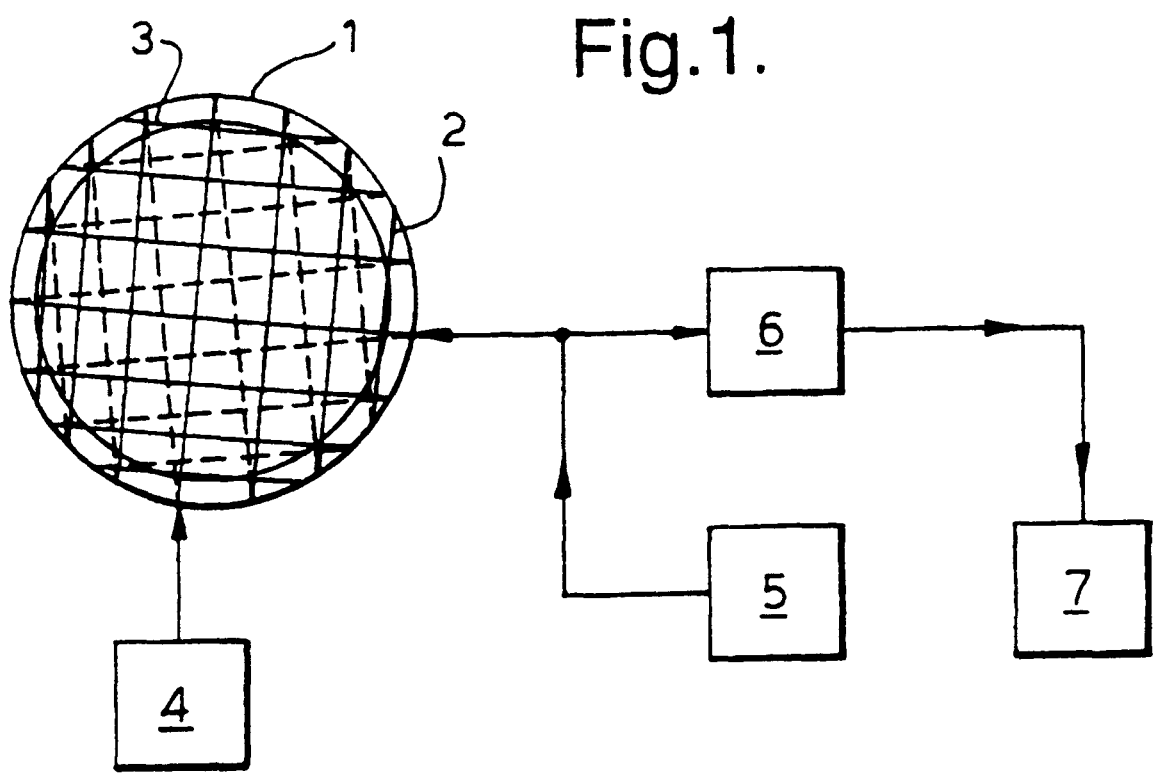

United States Patent
Gallop et al.

[11] Patent Number: 6,166,542
[45] Date of Patent: Dec. 26, 2000

[54] NUCLEAR MAGNETIC RESONANCE LEVEL GAUGING DEVICE

[75] Inventors: John Charles Gallop; Jeffrey Leslie Flowers, both of Teddington, United Kingdom

[73] Assignee: The Secretary of State for Trade and Industry in Her Brittanic Majesty's Government of the United Kingdom of Great Britain and Northern Ireland, London, United Kingdom

[21] Appl. No.: 09/068,927
[22] PCT Filed: Oct. 29, 1996
[86] PCT No.: PCT/GB96/02629
  § 371 Date: May 20, 1998
  § 102(e) Date: May 20, 1998
[87] PCT Pub. No.: WO97/19363
  PCT Pub. Date: May 29, 1997

[30] Foreign Application Priority Data

Nov. 22, 1995 [GB] United Kingdom .................... 9523846

[51] Int. Cl.⁷ ........................................................ G01V 3/00
[52] U.S. Cl. ............................................................... 324/300
[58] Field of Search ..................................... 324/300, 306, 324/312, 314, 307, 309, 318, 322; 73/290 V

[56] References Cited

U.S. PATENT DOCUMENTS

| | | |
|---|---|---|
| 4,166,972 | 9/1979 | King et al. .......................... 324/0.5 AC |
| 5,251,482 | 10/1993 | Bates et al. ............................ 73/290 V |
| 5,818,228 | 10/1998 | Menon et al. ........................... 324/300 |

FOREIGN PATENT DOCUMENTS

0605948A1  11/1993  European Pat. Off. .

*Primary Examiner*—Louis Arana
*Attorney, Agent, or Firm*—Thomas, Kayden, Horstemeyer & Risley L.L.P

[57] ABSTRACT

An NMR level gauging device comprising two sets of coils (2, 3) would orthogonal to one another about a tank (1). Each set is spaced apart about the tank (1) so as to be capable of providing a substantially uniform magnetic field through the tank when an electric current passes through them. A steady dc current being supplied to coils (2) from a supply (4) and an oscillating electromagnetic field at one or more fixed frequencies is supplied to coils (3) from supply (5); the sets of coils (2, 3) together providing for a substantially position independent sampling of a substance of interest i.eg. fuel, within the tank (1). Detection means (6, 7) are provided for detecting the amplitude of an induced resonance signal in the substance of interest and to provide an amplitude dependent output as a gauge of the amount of substance in the tank (1).

9 Claims, 2 Drawing Sheets

NUCLEAR MAGNETIC RESONANCE LEVEL GAUGING DEVICE

The present invention relates to a nuclear magnetic resonance (NMR) gauging device and in particular to one which may be employed in the non-invasive gauging of the quantity of a specific substance, for example fuel, present within a container, for example a fuel tank.

There exists a number of situations, for example in low or zero gravity environments; where the substance to be gauged is held in a neutrally buoyant suspension in another medium; where the substance is rapidly agitated so that its spatial distribution varies with time; or where the physical integrity of a container cannot be broken to permit a probe access to gauge the quantity of the contents; where the gauging of the quantity of a material cannot be carried out using conventional gauging devices which are based on, for example weighing, visual observation or volume measurements. Particularly there exists a problem in gauging the quantity of fuel in a fuel tank in a low gravity space environment such as may be found in orbiting satellite equipment.

A recent review of many current and proposed gauging methods is provided in "Propellant Determination Methods for Space Systems" by E. Kruzins and D. H. Parker presented at the CNES/ESA International Conference Propulsion des Vehicules Spatiaux, Toulouse November 1994 and which is incorporated herein by reference. The currently used gauges employ methods based on book-keeping, gas law or thermal methods or a combination of both book-keeping and one or other of the other two methods. Consequently these gauges have a common disadvantage that they are at their least accurate when the propellant is close to exhaustion, and the measurement accuracy is most critical.

It is the aim of the present invention to provide a gauging device suitable for operation in the low gravity environment and the other situations described previously and in which the measurement accuracy of the gauge is high even when the amount of specific substance to be measured within a container is at a reduced level.

The phenomenon of NMR is widely used in the chemical and structural analysis of materials and in medical imaging applications known as MRI. In these applications static magnetic fields of several Tesla are employed and the free precession or absorption frequencies are measured to determine what species are present.

Generally, NMR involves the detection of an induced magnetisation in an ensemble of nuclear spins of one or more species of interest within a substance which are to be determined when a resonance condition is established between an oscillating electromagnetic field and the nuclear spins in the presence of a static magnetic field of appropriate value. At this resonance condition the nuclear spins are able to resonantly absorb energy associated with the oscillating field of frequency, f and it is by monitoring the effects of the absorption of this energy on the ensemble of spins that the presence of otherwise of a particular spin species of interest may be determined.

In the present application any one of a free precession signal, a signal dependent on the change in amplitude of the oscillating electromagnetic field at resonance or an adiabatic fast passage signal may be monitored and processed to gauge the quantity of the substance of interest, for example fuel, present in a container, such as a fuel tank.

In the circumstances where the free precession signal is to be monitored then where an ensemble of nuclear spins of spin I is placed in a region of uniform static magnetic field of strength B applied parallel to the z-axis of a coordinate system a thermal equilibrium magnetisation arises from a resultant net polarisation of nuclear spins along the z-axis.

The pulsed application of an oscillating electromagnetic field of frequency $w_f$, having its magnetic field perpendicular to the static field causes the spins to re-orientate into the x-y plane of the coordinate system, provided that the resonance condition given by equation [1] below is satisfied. The magnetisation vector then precesses about the z-axis at an angular frequency, $w_f$, which is given by $$w_f = \mu_I B \quad [1]$$

where $\mu_I$ is the gyromagnetic ratio of the nuclear spin species which has been chosen to allow gauging of the substance of interest.

The time dependent magnitude, $M(t)$, of the magnetisation may then be monitored by monitoring the amplitude of the voltage at frequency $w_f$ which is induced in a coil of electrically conducting material wound externally of the substance of interest so as to internally define the volume of interest. From $M(t)$ the value $M(0)$, the magnetisation amplitude at time $t=0$ (the time at which the pulse ends) may be calculated. For an ensemble of N spins at temperature T the magnetisation $M(0)$ is given by $$M(0) = gPV(\mu_I h)^2 I(I+1) B/(3kT) \quad [2]$$

where P is the density of substance being gauged;
V is the volume which the substance occupies;
h is Planck's constant;
I is the nuclear spin; and
g is a position sensitive, filling factor.

Thus provided g, T and the properties of the nuclear spin species are known a calculation of $M(0)$ provides a measure of the volume V which the substance being measured occupies, from which the quantity of substance can be gauged.

According to a first aspect of the present invention there is provided a nuclear magnetic resonance (NMR) gauging device comprising a means for producing a substantially uniform magnetic field along an axis through a container containing a substance of interest; a supply means for supplying an oscillating electromagnetic field at one or more fixed frequencies; a supply coil operably connected to the supply means for providing the electromagnetic field perpendicular to the axis through the container; and detection means for detecting an induced resonance signal in the substance of interest wherein the supply coil is configured to supply an oscillating field having an amplitude distribution adapted to permit substantially position independent sampling and the detection means is adapted to monitor the amplitude of the induced resonance signal and to provide an amplitude dependent output as a gauge of the amount of the substance present within the container.

This has the advantage that the NMR gauging device provides a direct measure of the substance of interest and so is able to maintain its gauging accuracy as the substance becomes depleted.

Where the container is of cylindrical section the supply coil may comprise a solenoidal coil wound coaxially with the container with uniform pitch along the long axis of the container. Additional shim windings may be provided at the ends of the solenoidal coil in order to compensate for the finite length of the coil. Where the container is spherical or ellipsoidal, as is often the case with fuel tanks in satellites, then the supply coil may comprise a coil wound on a spherical former with uniform pitch along a diameter which defines the coil axis. Usefully the supply coil is wound external of the container so thereby retain the structural integrity of the container.

Numerical modelling may be employed to predict the coil geometry necessary to provide substantially position independent sampling when other shaped containers are used. A suitable numerical model is based on a solution of Poisson's equation for the scalar magnetic potential over the volume within the coil geometry, which model will yield a uniform axial magnetic field component $B_z$ along the so called z-axis with other components of the B-field being much less than B everywhere.

It will be appreciated that if the B-field generated by passing a current through a coil is uniform then so too will be the electric field. This method is therefore applicable to the determination of the geometry of the supply coil and also the coils which may be employed as an electro-magnet, this magnet being the means of providing a uniform magnetic field.

The detection means may comprise an electrically conducting coil, preferably the same coil as the supply coil for simplicity of construction, in operable connection with a volt meter. As indicated in the preceding paragraph the supply coil is capable of producing substantially uniform electric and magnetic fields throughout the container and therefore provides detection means having substantially uniform detection characteristics throughout the container.

Most usefully, the supply means is adapted to provide sequentially two electromagnetic fields, each oscillating at a different known frequency and the detection means additionally comprises a comparator for comparing the amplitudes of the induced resonance signals at the known two frequencies.

This has the advantage that the need to make a measurement of the temperature, T is avoided. This is because the frequencies are chosen so as to permit second magnetisation measurement to be made for a different nuclear spin species, present in a known concentration relative to the first, for example an isotope of the first species may be used. Then, assuming this second species has a nuclear spin J and a gyromagnetic ratio $\mu_J$ then by analogy with equation [1] above a second voltage, at $w_J$ will be induced in the coils at resonance. A calculation of the two magnetisation amplitudes, $M_I(0)$ and $M_J(0)$, provide two solutions to equation [2], with two unknowns, V and T and can be used to eliminate T. This additional measurement also has the further advantage that if T is not spatially uniform, varying by an amount dT, then measurement of the second spin species may be used to compensate for this inhomogeneity.

Clearly these two same advantages would result from employing a single frequency in conjunction with a variable magnetic field to measure resonances of different spin species.

Typically the uniform magnetic field has a flux density of less than 1 Tesla and is usually of the order of milli-Tesla.

According to a second aspect of the present invention there is provided a method for gauging the quantity of a substance in a container comprising the steps of:

a) Applying a substantially uniform static magnetic field throughout a container volume to be sampled parallel to an axis through the container;

b) Applying substantially perpendicular to the axis one or more oscillating electromagnetic fields of appropriate frequencies and having amplitude distributions adapted to provide for substantially position independent sampling;

c) Monitoring the effects of the resonant absorption of electromagnetic energy associated with the oscillating field by an ensemble of nuclear spins of a specific species within the container to provide an output signal dependent on the strength of the effect; and d) Processing the output signal to provide a gauge of the quantity of substance present within the container.

An embodiment of the invention will now be described, by way of example only, with reference to the drawings of the accompanying figures in which:

FIG. 1: is a schematic representation of an NMR gauging device according to the first aspect of the present invention.

Figure 2:
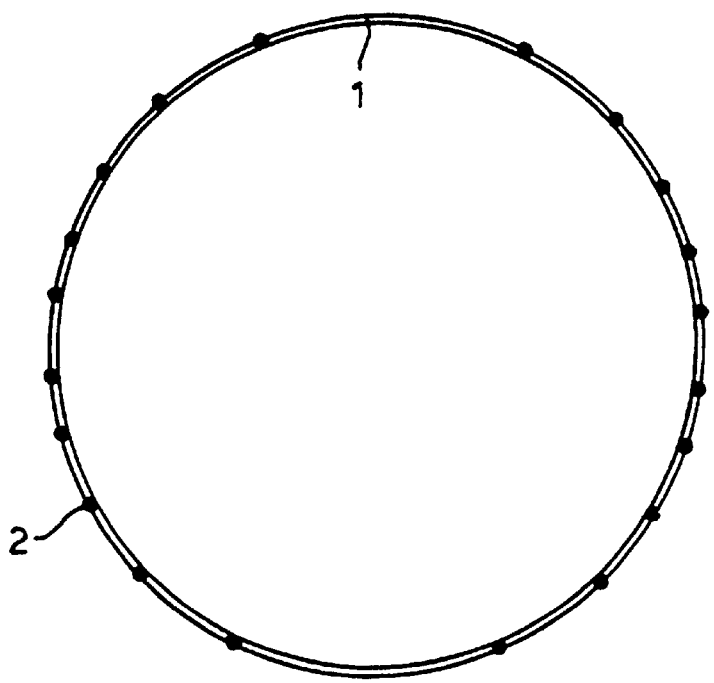

FIG. 2: is a schematic of a cross-section of the fuel tank and coil arrangement of FIG. 1.

Figure 3:
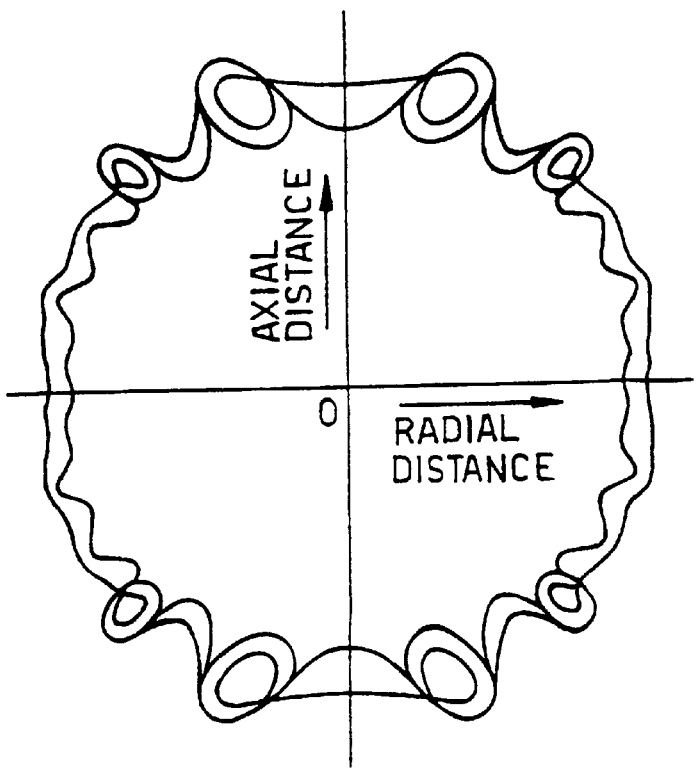

FIG. 3: is a magnetic field plot for the coil arrangement of FIG. 2.

Referring now to FIG. 1, a spherical, or ellipsoidal fuel tank 1 has about its external surface two orthogonally wound spherical coils 2, 3 of the fuel gauge. A steady dc current is supplied to one set of coils 2 from a power supply 4 to provide a static field B, along the z axis, of the order of several milli-Tesla. An ac current is supplied via the power supply 5 to the other coils 3 at a frequency $w_I$. Each of these two sets of coils 2, 3 are spaced about the tank 1 as shown by (•) for the dc current coils 2 in FIG. 2, to produce the magnetic field plot shown in FIG. 3 where contours connect points with the same B field values. As may be deduced from FIG. 3 the cross-hatched region has a total field variation of less than 10% from the man field value and represents over 90% of the spherical volume of the tank 1. As will be apparent to those skilled in the art the uniformity of the field scales with the number of turns so that, for example a 100 turn gauging device will provide approximately a 1% variation over 99% of the spherical volume of the same tank.

Spin species of nuclear spin I, present within the fuel in the fuel tank 1 will resonantly absorb this ac energy and any changes in the amplitude of the voltage induced in these coils 3 at that frequency is measured by the detector 6, which may include a low noise amplifier. The detector 6 is operably connected to an analyser 7, for example a suitably programmed computer, which from this measured voltage, calculates the magnetisation amplitude $M_I(0)$ and hence the quantity of the nuclear spin species, of spin I, present within the fuel tank 1 to provide a gauge of fuel within the tank 1.

The frequency of the ac current may then be varied to $w_J$ so that resonant absorption by a second spin species of spin J, present in the fuel in a known abundance relative to the species I, will occur. This enables a second magnetisation amplitude $M_J(0)$ to be calculated by the analyser 7 which amplitude may be used within the analyser to compensate for small variations in temperature within the fuel tank 1 which would otherwise lead to inaccuracies in the gauging of the fuel.

What is claimed is:

1. A nuclear magnetic resonance (NMR) gauging device comprising: a means for producing a substantially uniform magnetic field along an axis through a container containing a substance of interest; a means for supplying an oscillating electromagnetic field at one or more fixed frequencies; a supply coil operably connected to the means for supplying such that the supply coil provides an electromagnetic field perpendicular to the axis through the container; and a means for detecting an induced resonance signal in the substance of interest, wherein the supply coil is configured to supply an oscillating electromagnetic field having an amplitude distribution adapted to permit substantially position independent sampling by the means for detecting and wherein the means for detecting is adapted to monitor the amplitude of the induced resonance signal and to provide an output signal corresponding to an amount of the substance present within the container.

2. The device of claim 1, wherein the means for supplying is adapted to provide sequentially a first electromagnetic field having a first frequency and a second electromagnetic field having a second frequency different from the first frequency, and wherein the means for detecting further comprises a means for comparing amplitudes of a first induced resonance signal corresponding to the first frequency and a second induced resonance signal corresponding to the second frequency.

3. The device of claim 1 or claim 2, wherein the means for producing the substantially uniform magnetic field produces the substantially uniform magnetic field of less than 1 Tesla.

4. The device of claim 3, wherein the means for producing the substantially uniform magnetic field is adapted to produce a field on the order of milli-Tesla.

5. The device of claim 3, wherein the means for producing the substantially uniform magnetic field comprises an electrically conducting coil orthogonal to the supply coil.

6. The device of claim 1, wherein the container is a fuel tank and wherein the output signal corresponds to the amount of fuel in the fuel tank.

7. The device of claim 1, wherein the supply coil is provided external of the container.

8. A method for gauging the quantity of a substance in a container comprising the steps of:

a) Applying a substantially uniform magnetic field throughout a container to be sampled such that the magnetic field is substantially parallel to an axis through the container;

b) Applying at least one oscillating electromagnetic field perpendicular to the substantially uniform magnetic field, each one of the at least one oscillating electromagnetic fields having a predefined frequency and having an amplitude distribution adapted to provide for substantially position independent sampling;

c) Monitoring an effect corresponding to a resonant absorption of electromagnetic energy associated with each one of the at least one oscillating magnetic field within the container;

d) Providing an output signal such that the output signal is dependent on the strength of the effect; and e) Processing the output signal to provide a gauge of the quantity of substance present within the container.

9. The method of claim 8, wherein the resonant absorption of the electromagnetic energy corresponds to the nuclear spins of at least one species of matter within the container.

* * * * *